(12) United States Patent
Han et al.

(10) Patent No.: US 7,804,437 B2
(45) Date of Patent: Sep. 28, 2010

(54) ANALOG-TO-DIGITAL CONVERTER FOR ACCUMULATING REFERENCE VOLTAGES SUCCESSIVELY DIVIDED BY TWO

(75) Inventors: Gunhee Han, Goyang-si (KR); Jeonghwan Lee, Seoul (KR); Seunghyun Lim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/292,787

(22) Filed: Nov. 26, 2008

(65) Prior Publication Data
US 2009/0135041 A1    May 28, 2009

(30) Foreign Application Priority Data
Nov. 26, 2007  (KR) .................. 10-2007-0121053

(51) Int. Cl.
*H03M 1/34* (2006.01)
(52) U.S. Cl. ...................... 341/164; 341/155
(58) Field of Classification Search ............... 341/155, 341/161, 163, 164
See application file for complete search history.

(56) References Cited

U.S. PATENT DOCUMENTS

| 4,529,965 A | | 7/1985 | Lee | |
| 5,028,926 A | * | 7/1991 | Tokuhiro | 341/161 |
| 6,809,674 B1 | * | 10/2004 | Ramsden | 341/155 |

FOREIGN PATENT DOCUMENTS

| JP | 1993-175845 | 7/1993 |
| JP | 06-216772 | 8/1994 |
| JP | 11-008535 | 1/1999 |
| KR | 10-2000-0001332 | 1/2000 |
| KR | 10-2001-0030941 | 4/2001 |

OTHER PUBLICATIONS

Korean Notice to Submit Response dated Oct. 26, 2009.
Jihyun Cho, Dongmyung Lee, and Gunhee Han, "A Time Based Active Pixel Sensor for Low Voltage CIS," in Proc. Int. SoC Design Conf., Seoul, Korea, Oct. 2006, pp. 109-112.
Kungee Cho, Dongmyung Lee, and Gunhee Han, "Low Voltage Time Based CMOS Active Pixel Sensor," in IEEE Int. SoC Design Conf., Busan, Korea, Nov. 2008, pp. 97-100.
Kunhee Cho, Dongmyung Lee, Jeonghwan Lee, and Gunhee Han, "A 0.75V CMOS Image Sensor Using Time-Based Readout Circuit," in Proc. IEEE Symp. on VLSI Circuits, Kyoto, Japan, Jun. 2009, pp. 178-179.
"Novel Multiple Reference Voltage Generation Scheme for Pipeline A/D Conversion," IEEE Electronic Letter, Apr. 27, 1989, vol. 25 No. 9.
Korean Notice to Submit Response dated Mar. 27, 2009.
Notice to Submit Response to Office Action for corresponding Korean Patent Application No. 10-2007-0121053 dated May 25, 2010.

* cited by examiner

*Primary Examiner*—Brian Young
(74) *Attorney, Agent, or Firm*—Harness, Dickey & Pierce, P.L.C.

(57) ABSTRACT

An analog-to-digital converter includes a ½ powered signal generator configured to generate divided signals by successively dividing a full scale signal by 2 and output one of the divided signals, an accumulator configured to update a reference signal according to a current divided signal and a current output bit, and a comparator configured to compare the updated reference signal with an input signal and generate a next output bit.

16 Claims, 9 Drawing Sheets

ANALOG-TO-DIGITAL CONVERTER FOR ACCUMULATING REFERENCE VOLTAGES SUCCESSIVELY DIVIDED BY TWO

FOREIGN PRIORITY STATEMENT

This application claims priority under 35 U.S.C. §119 to Korean Patent Application No. 10-2007-0121053, filed on Nov. 26, 2007, in the Korean Intellectual Property Office (KIPO), the entire contents of which are incorporated herein by reference.

BACKGROUND

1. Field

Example embodiments relate to an analog-to-digital converter (ADC) for converting an analog signal to a digital signal, and more particularly, to a high-speed ADC which does not belong to conventional categories.

2. Description of the Related Art

With the rapid increase of demand on wideband digital communication, demand for an analog-to-digital converter (ADC) having higher speed and higher resolution is increasing. An ADC, for example an image sensor which maybe used for digital communication or a digital camera, may be used in the field of converting an audio signal or a video signal to a digital signal.

A conventional ADC may include a reference voltage generator and a structure for comparing a reference voltage generated by the reference voltage generator with an input signal (which may be converted into a voltage) The conventional ADC may obtain an approximate value of the input signal and convert the approximate value into a digital signal.

Various methods of increasing resolution using a circuit occupying a small area based on the basic structure described above with respect to an ADC have been researched and developed.

Examples of ADCs using different methods may include flash ADCs, folding and interpolating ADCs, and pipeline ADCs.

The folding and interpolating ADCs may have advantages of one-step conversion, low power consumption, and a small area. However, in order to increase the resolution of the folding and interpolating ADCs, a folding factor may be increased. When the folding factor increases, non-linearity may increase. To solve the problem, a method of cascading a plurality of folding stages having a small folding factor has been suggested.

The flash ADCs may have the simplest structure and the highest operating speed. $2^N-1$ comparators may be needed in order to implement an N-bit flash ADC. Accordingly, there may be a problem in that a large area may be needed to implement a flash ADC having high resolution.

The pipeline ADCs may cascade a plurality of comparator stages, and may thereby achieve high resolution with a small number of comparators. The pipeline ADCs may be slower than the flash ADCs but may also decrease a necessary area.

SUMMARY

Example embodiments provide an analog-to-digital converter (ADC) which may have a new structure which does not belong to conventional categories of ADCs.

Example embodiments also provide an ADC which may require a decreased area in comparison with conventional ADCs.

An ADC according to example embodiments, may include a ½ powered voltage generator which may be configured to generate divided voltages by successively dividing a full scale voltage by 2 and to output one of the divided voltages, an accumulator which may be configured to update a reference voltage according to a current divided voltage and a current output bit, and a comparator which may be configured to compare an updated reference voltage with a voltage of an input signal and generate a next output bit.

An ADC according to example embodiments may include a ½ powered voltage generator which may be configured to generate a second divided voltage corresponding to ½ of a first divided voltage and to output the second divided voltage, an accumulator which may be configured to generate a second reference voltage by subtracting the second divided voltage from or adding the second divided voltage to a first reference voltage according to a first output bit, and a comparator which may be configured to compare the second reference voltage with a voltage of an input signal and generate a second output bit.

An ADC according to example embodiments may include an input array which may be configured to output a plurality of input signals, a ½ powered voltage generator which may be configured to generate divided voltages by successively dividing a full scale voltage by 2 and to output one of the divided voltages, an accumulator which may be configured to update a reference voltage according to a current divided voltage and a first output bit with respect to a corresponding one of the input signals, and a comparator which may be configured to compare an updated reference voltage with a voltage of the corresponding input signal and generate a second output bit following the first output bit.

An analog-to-digital conversion method according to example embodiments may include generating divided voltages by successively dividing a full scale voltage by 2, outputting one of the divided voltages as a current divided voltage, updating a reference voltage according to the current divided voltage and a current output bit, and comparing an updated reference voltage with a voltage of an input signal and generating a next output bit.

An analog-to-digital conversion method according to example embodiments may include generating and outputting a second divided voltage corresponding to ½ of a first divided voltage, generating a second reference voltage by subtracting the second divided voltage from or adding the second divided voltage to a first reference voltage according to a first output bit, and comparing the second reference voltage with a voltage of an input signal and generating a second output bit.

BRIEF DESCRIPTION OF THE DRAWINGS

The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DETAILED DESCRIPTION OF THE EMBODIMENTS

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Figure 1:
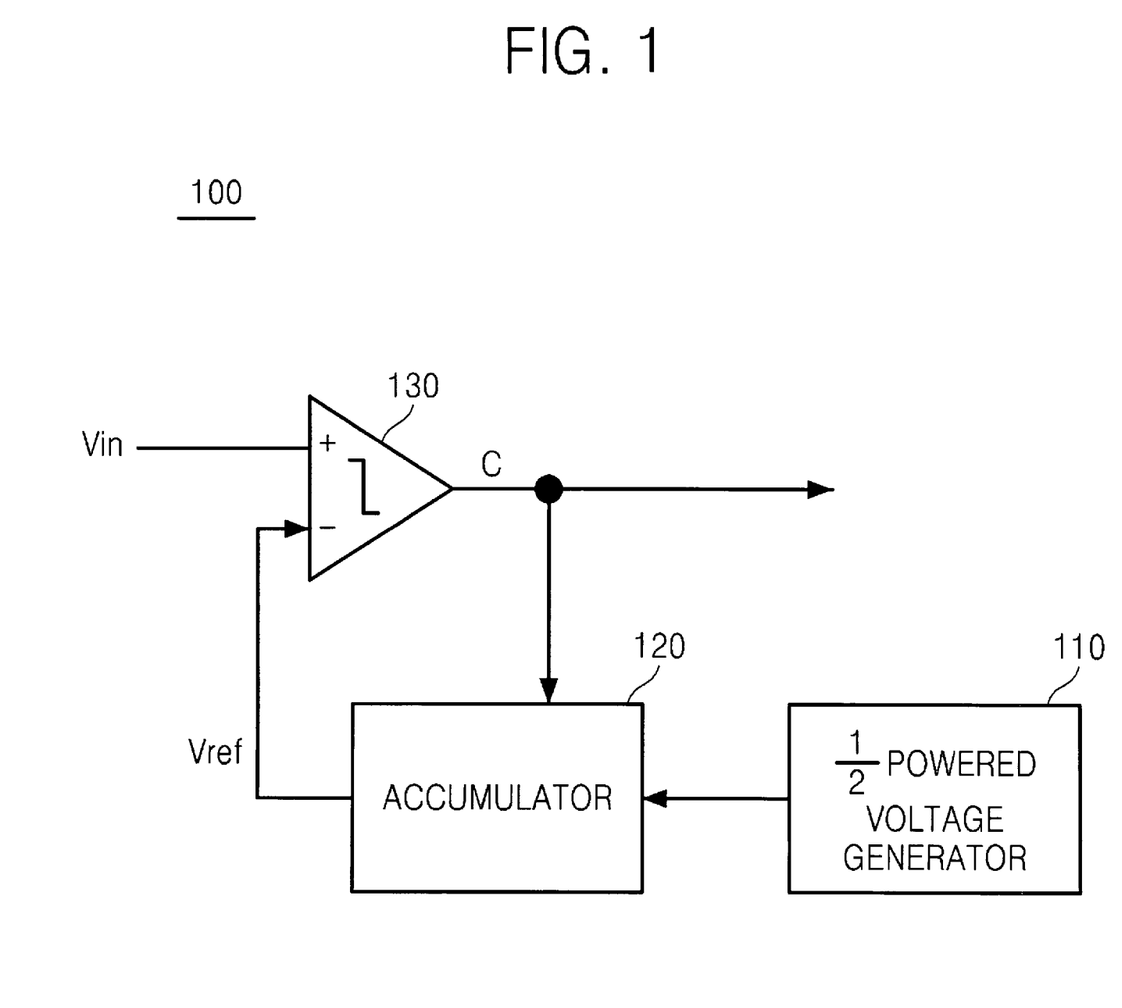
FIG. 1 illustrates an analog-to-digital converter (ADC) according to example embodiments.

FIG. 1 illustrates an analog-to-digital converter (ADC) 100 according to example embodiments. Referring to FIG. 1, the ADC 100 may include a ½ powered voltage generator 110, an accumulator 120, and a comparator 130.

The ½ powered voltage generator 110 may generate divided voltages by successively dividing a full scale voltage by 2 and may output one of the divided voltages. When the full scale voltage is $V_{FS}$, the divided voltages may be ½ $V_{FS}$, ¼ $V_{FS}$, ⅛ $V_{FS}$ and so on.

A current reference voltage Vref may be referred to as Vref[1]. The accumulator 120 may update a reference voltage Vref. An updated reference voltage Vref may be referred to as Vref[2]. The comparator 130 may generate an output bit C. A first output bit C may be referred to as C[1]. The accumulator 120 may update a current reference voltage Vref[1] based on the divided voltage output from the ½ powered voltage generator 110 and the output bit C[1]. The accumulator 120 may determine whether to subtract the divided voltage from or add the divided voltage to a current reference voltage Vref[1] according to the output bit C[1]. The accumulator 120 may generate the updated reference voltage Vref[2] by subtracting or adding the divided voltage from or to the current reference voltage Vref[1] according to the output bit C[1].

The comparator 130 may compare the updated reference voltage Vref[2] with an input signal voltage Vin and generate a next output bit C[2]. At this time, the comparator 130 may output "0" as a value of the next output bit C[2] when the input signal voltage Vin is less than the updated reference voltage Vref[2] and may output "1" as the value of the next output bit C[2] when the input signal voltage Vin is not less than the updated reference voltage Vref[2].

According to example embodiments, the ½ powered voltage generator 110 may output a divided voltage corresponding to ½ of a previous divided voltage according to a time period. For instance, the ½ powered voltage generator 110 may output a divided voltage of ½ $V_{FS}$ during the first time period, a divided voltage of ¼ $V_{FS}$ during the second time period, and a divided voltage of ⅛ $V_{FS}$ during the third time period.

According to example embodiments, the ½ powered voltage generator 110, the accumulator 120, and the comparator 130 may operate in response to a clock signal having a predetermined or reference cycle.

The ADC 100 may determine a digital output corresponding to an analog input sequentially from an upper bit to a lower bit.

A successive approximation register (SAR) ADC may have a similar structure to that of the ADC 100. Although the SAR ADC may determine a digital output sequentially from an upper bit to a lower bit, the SAR ADC may generate a reference voltage compared with an input signal using a digital-to-analog converter (DAC). The DAC may occupy a large area in the ADC and most of power consumption of the ADC may be caused by the DAC. The ADC 100 according to example embodiments may not use a DAC but may generate a reference voltage using the ½ powered voltage generator 110 and the accumulator 120, thereby decreasing power consumption and a necessary area as compared to the SAR ADC. In addition, the ADC 100 may also provide a new category of an ADC structure which may generate the reference voltage used to determine a next bit without a separate SAR. Moreover, the ADC 100 may provide an ADC structure that increases the resolution of a digital output without increasing a necessary area.

Figure 2:
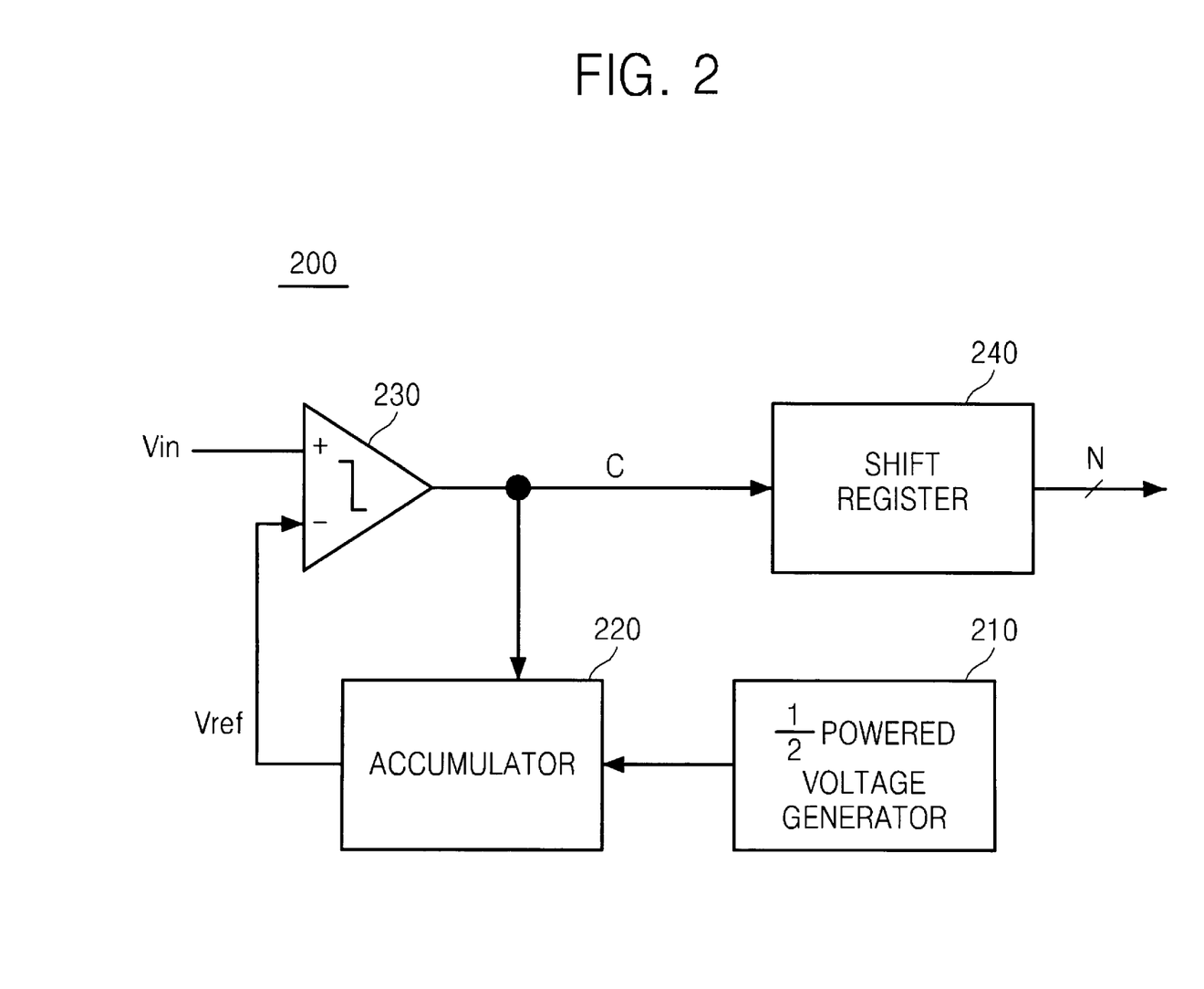
FIG. 2 illustrates an ADC according to example embodiments.

FIG. 2 illustrates an ADC 200 according to example embodiments. The ADC 200 may include a ½ powered voltage generator 210, an accumulator 220, a comparator 230, and a shift register 240.

The ½ powered voltage generator 210 may generate divided voltages by successively dividing a full scale voltage by 2 and may output one of the divided voltages. The accumulator 220 may update a current reference voltage Vref[1] based on the divided voltage output from the ½ powered voltage generator 210 and an output bit C[1] and may generate an updated reference voltage Vref[2]. The comparator 230 may compare the updated reference voltage Vref[2] with an input signal voltage Vin and may generate a next output bit C[2]. The shift register 240 may store the next output bit C[2]. When the ADC 200 has a resolution of N bits, the shift register 240 may shift output bits and generate an output bitstream of N bits.

According to example embodiments, the ½ powered voltage generator 210 may output a second divided voltage corresponding to ½ of a first divided voltage. The accumulator 220 may generate the second reference voltage Vref[2] by subtracting or adding the second divided voltage from or to the first reference voltage Vref[1] according to the first output bit C[1]. The comparator 230 may compare the second reference voltage Vref[2] with the input signal voltage Vin and may generate the second output bit C[2]. The ½ powered voltage generator 210 may output the second divided voltage a predetermined or reference clock time after outputting the first divided voltage.

Figure 3:
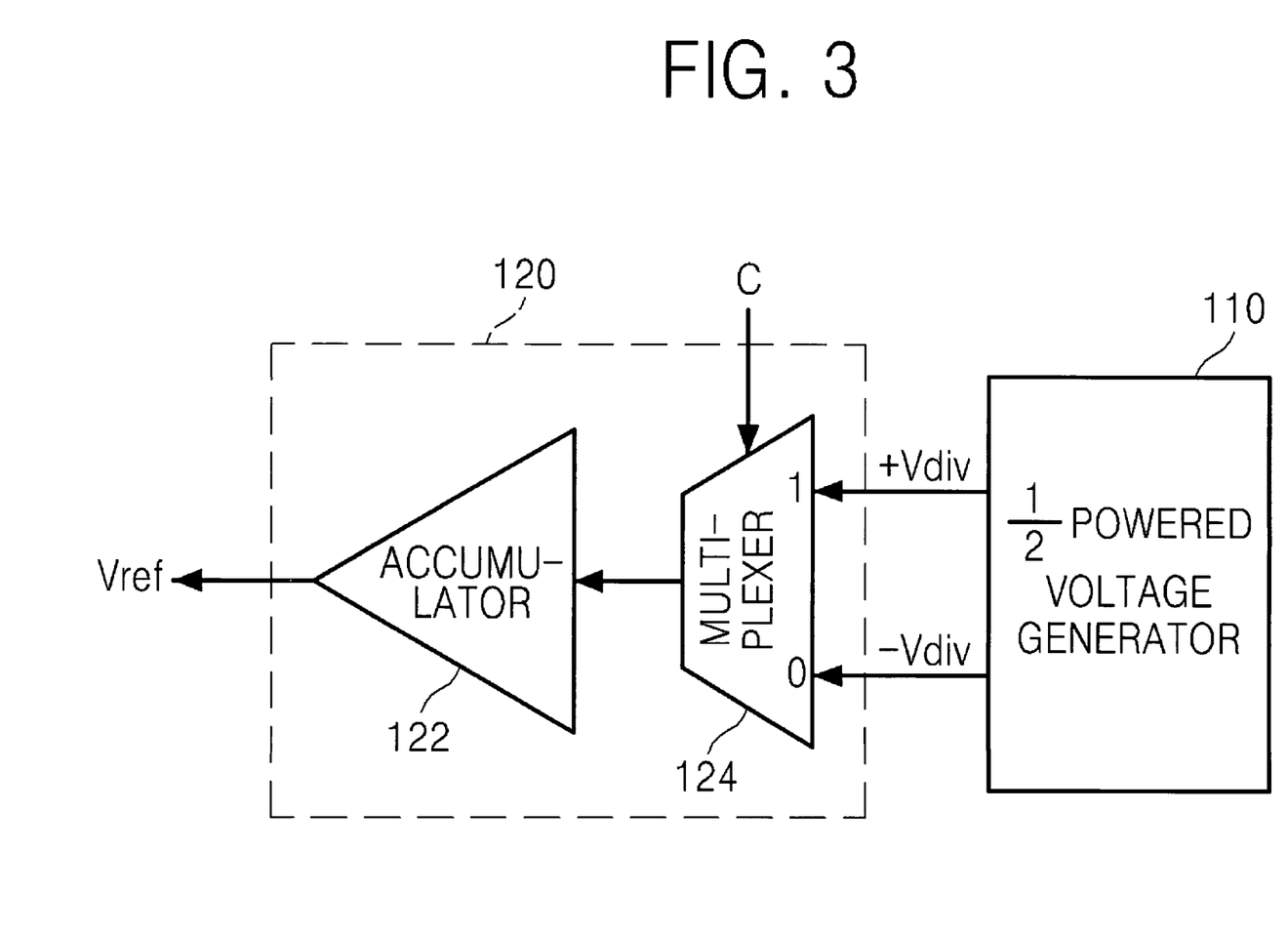
FIG. 3 illustrates the structure and the operations of a ½ powered voltage generator and an accumulator according to example embodiments.

FIG. 3 is a block diagram illustrating the structure and operations of the ½ powered voltage generator 110 and the accumulator 120. Referring to FIG. 3, the ½ powered voltage generator 110 may change the phase of a divided voltage and may output voltages +Vdiv and −Vdiv. The accumulator 120 may include a multiplexer and an accumulation part.

The multiplexer may select one of the voltages +Vdiv and −Vdiv in response to the output bit C[1] and may output a selected one to the accumulation part. The accumulation part may add the voltage selected and output by the multiplexer to the current reference voltage Vref[1] and may generate the updated reference voltage Vref[2].

When the output bit C[1] is "1", the multiplexer may select and output the voltage +Vdiv. The accumulation part may add the voltage +Vdiv to the current reference voltage Vref[1] and may generate the updated reference voltage Vref[2]. When the output bit C[1] is "0", the multiplexer may select and output the voltage −Vdiv. The accumulation part may add the voltage −Vdiv to the current reference voltage Vref[1] and may generate the updated reference voltage Vref[2].

Figure 4A:
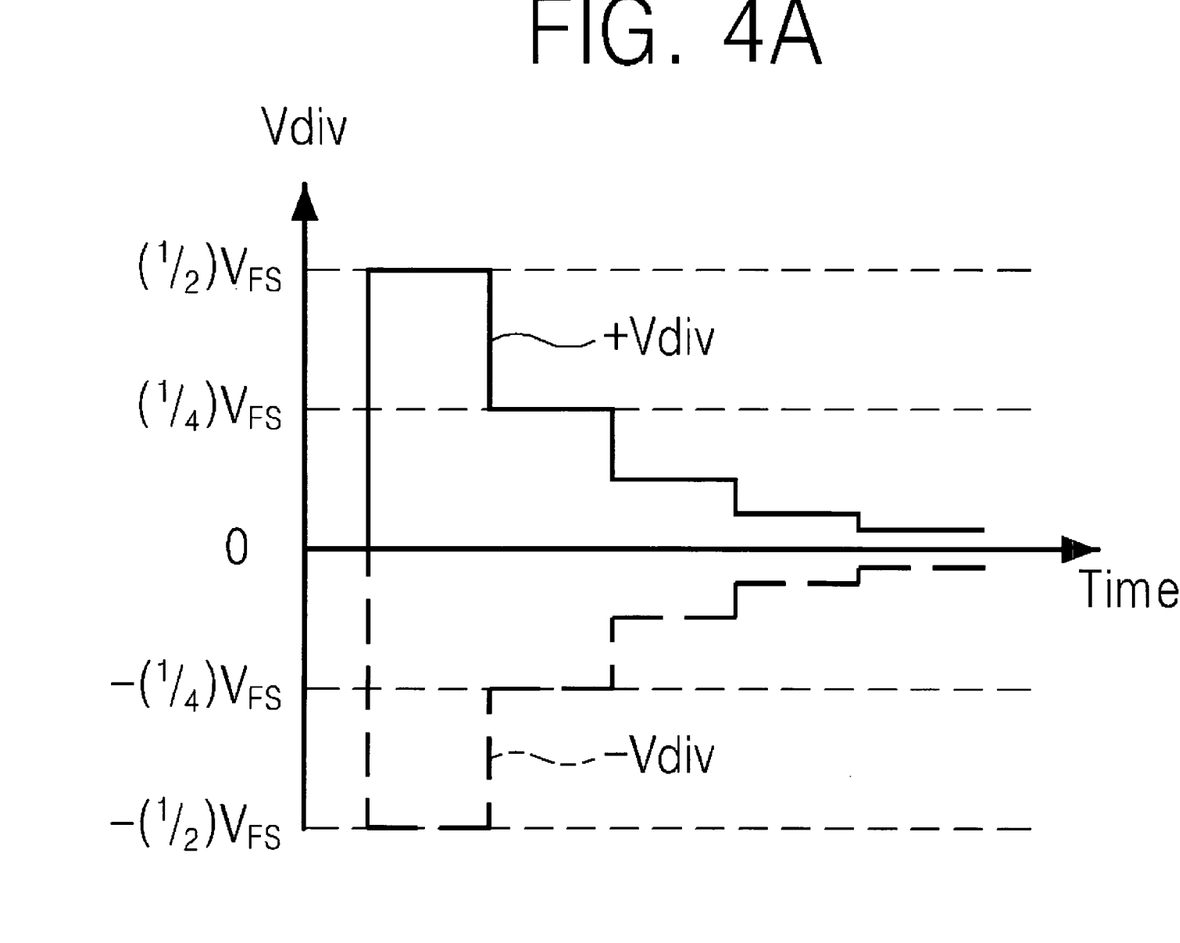
FIGS. 4A-C illustrate a procedure of conversion performed by the ADC illustrated in FIG. 2.
Figure 4B:
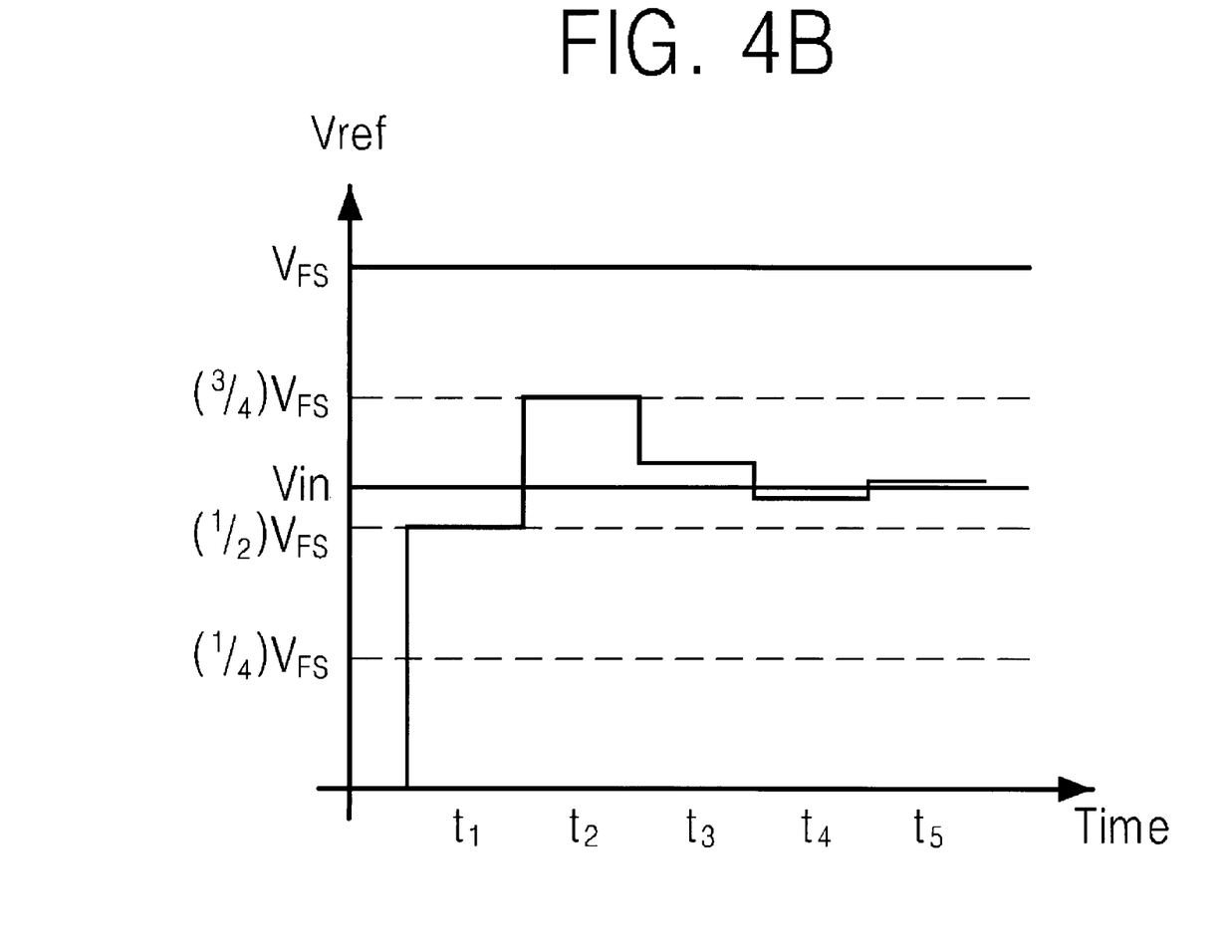
Figure 4C:
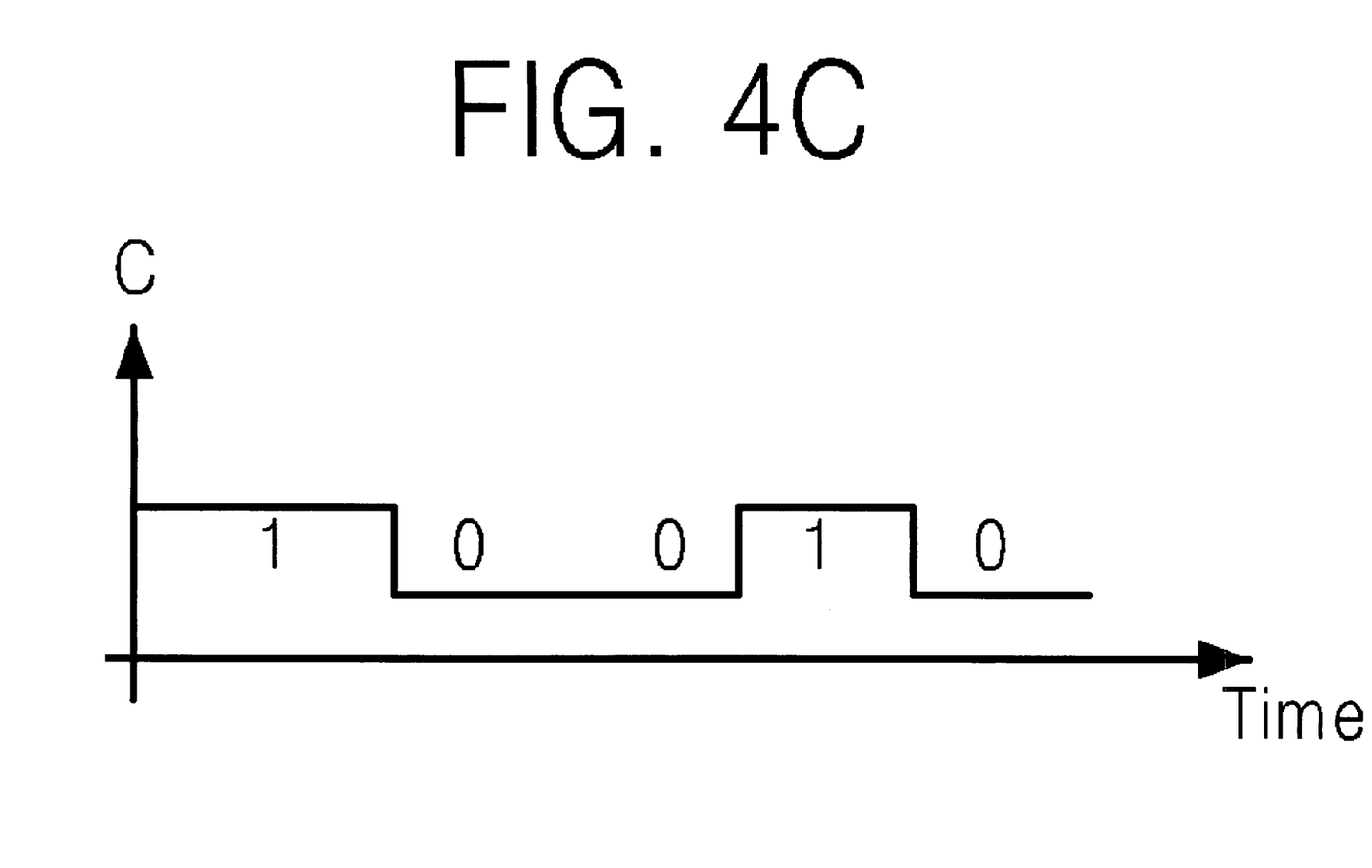

FIGS. 4A-C illustrate a procedure of conversion performed by the ADC 200 illustrated in FIG. 2. The horizontal axes in the graphs illustrated in FIGS. 4A-C, are time, and the vertical axes in the graphs illustrated in FIGS. 4A-C are a divided voltage, an updated reference voltage, and an output bit, respectively.

In the example illustrated in FIGS. 4A-C, during a first time period $t_1$, the ½ powered voltage generator 210 may output ½ $V_{FS}$ as the divided voltage +Vdiv and −½ $V_{FS}$ as the divided voltage −Vdiv. A default value of an output bit may be "1". Accordingly, the accumulator 220 may output ½ $V_{FS}$ as a reference voltage Vref[$t_1$]. The comparator 230 may compare the input signal voltage Vin with the reference voltage Vref[$t_1$] and may output "1" as the first output bit C[1] since the input signal voltage Vin is greater than the reference voltage Vref[$t_1$].

During a second time period $t_2$, the ½ powered voltage generator 110 may output ¼ $V_{FS}$ as the divided voltage +Vdiv and −¼ $V_{FS}$ as the divided voltage −Vdiv. The accumulator 220 may add ¼ $V_{FS}$ corresponding to the divided voltage +Vdiv to the previous reference voltage Vref[$t_1$] in response to the value "1" of the first output bit C[1] and may generate a current reference voltage Vref[$t_2$]. The accumulator 220 may output the generated reference voltage Vref[$t_2$]. At this time, the generated reference voltage Vref[$t_2$] may be ½ $V_{FS}$+¼ $V_{FS}$. The comparator 230 may compare the input signal voltage Vin with the reference voltage Vref[$t_2$] and outputs "0" as the second output bit C[2] since the input signal voltage Vin is less than the reference voltage Vref[$t_2$].

During a third time period $t_3$, the ½ powered voltage generator 210 may output ⅛ $V_{FS}$ as the divided voltage +Vdiv and −⅛ $V_{FS}$ as the divided voltage −Vdiv. The accumulator 220 may add −⅛ $V_{FS}$ corresponding to the divided voltage −Vdiv to the previous reference voltage Vref[$t_2$] in response to the value "0" of the second output bit C[2] and may generate a current reference voltage Vref[$t_3$]. The accumulator 220 may output the generated reference voltage Vref[$t_3$]. At this time, the generated reference voltage Vref[$t_3$] may be ½ $V_{FS}$+¼ $V_{FS}$−⅛ $V_{FS}$=⅝ $V_{FS}$. The comparator 230 may compare the input signal voltage Vin with the reference voltage Vref[$t_3$] and may output "0" as a third output bit C[3] since the input signal voltage Vin is less than the reference voltage Vref[$t_3$].

During a fourth time period $t_4$, the ½ powered voltage generator 110 may output 1/16 $V_{FS}$ as the divided voltage +Vdiv and −1/16 $V_{FS}$ as the divided voltage −Vdiv. The accumulator 220 may add −1/16 $V_{FS}$ corresponding to the divided voltage −Vdiv to the previous reference voltage Vref[$t_3$] in response to the value "0" of the third output bit C[3] and may generate a current reference voltage Vref[$t_4$]. The accumulator 220 may output the generated reference voltage Vref[$t_4$]. At this time, the generated reference voltage Vref[$t_4$] may be ⅝ $V_{FS}$−1/16 $V_{FS}$=9/16 $V_{FS}$. The comparator 230 may compare the input signal voltage Vin with the reference voltage Vref[$t_4$] and may output "1" as a fourth output bit C[4] since the input signal voltage Vin is greater than the reference voltage Vref[$t_4$].

During a fifth time period $t_5$, the ½ powered voltage generator 110 may output 1/32 $V_{FS}$ as the divided voltage +Vdiv and −1/32 $V_{FS}$ as the divided voltage −Vdiv. The accumulator 220 may add 1/32 $V_{FS}$ corresponding to the divided voltage +Vdiv to the previous reference voltage Vref[$t_4$] in response to the value "1" of the fourth output bit C[4] and may generate a current reference voltage Vref[$t_5$]. The accumulator 220 may output the generated reference voltage Vref[$t_5$]. At this time, the generated reference voltage Vref[$t_5$] may be 9/16 $V_{FS}$+1/32 $V_{FS}$=19/32 $V_{FS}$. The comparator 230 may compare the input signal voltage Vin with the reference voltage Vref[$t_5$] and may output "0" as a fifth output bit C[5] since the input signal voltage Vin is less than the reference voltage Vref[$t_5$].

The shift register 240 may sequentially store the first through fifth output bits C[1] to C[5] and may generate a digital output. As FIG. 4C illustrates the digital output may have a value of "10010". Accordingly, based on the digital output, it may be inferred that the input signal voltage Vin is greater than 18/32 $V_{FS}$ and less than 19/32 $V_{FS}$.

In the example illustrated in FIGS. 4A-C, the first output bit C[1] generated during the first time period $t_1$ is the most significant bit (MSB) and the fifth output bit C[5] generated during the fifth time period $t_5$ is the least significant bit (LSB).

Figure 5:
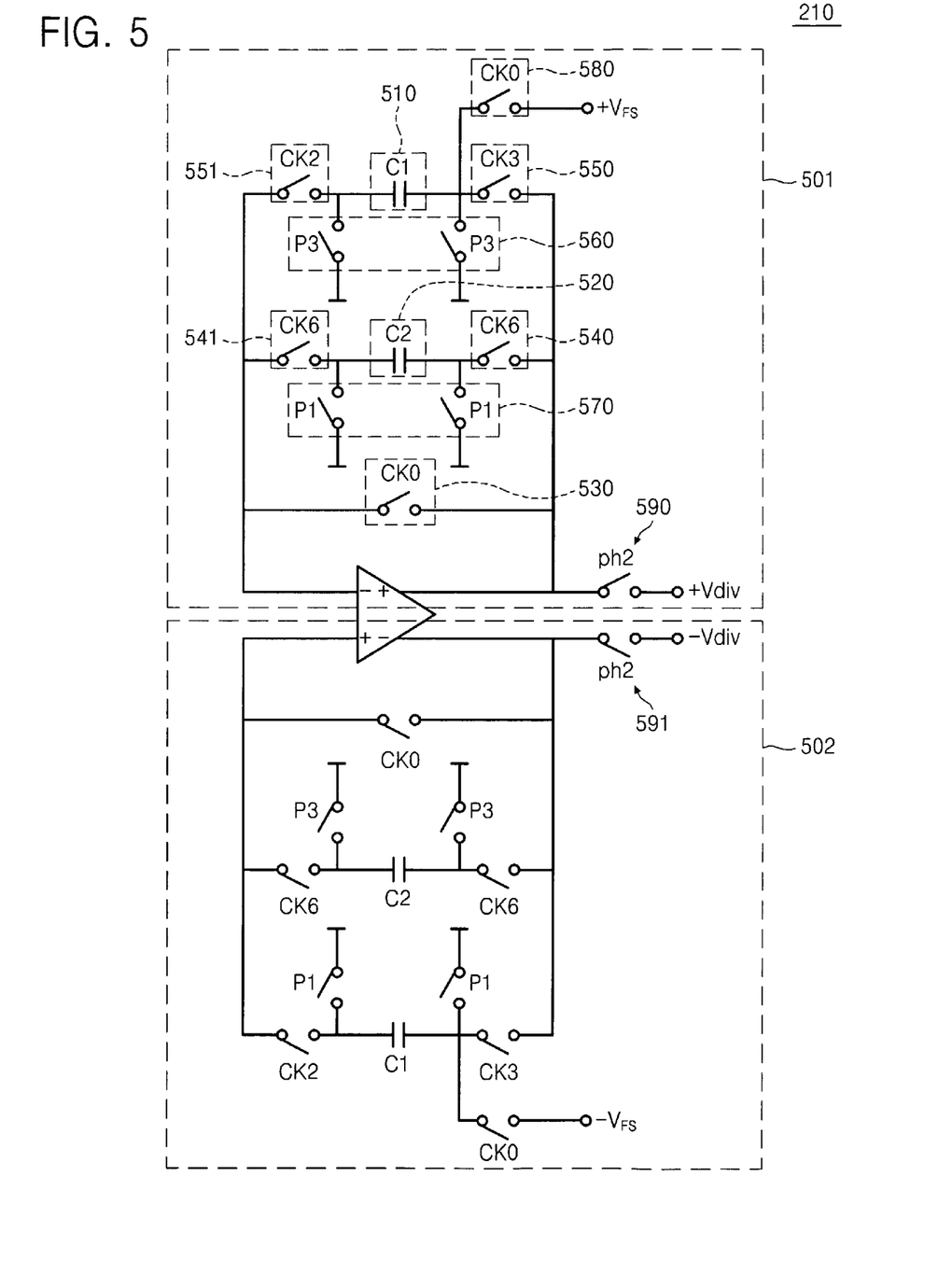
FIG. 5 illustrates a ½ powered voltage generator according to example embodiments.

FIG. 5 illustrates the ½ powered voltage generator 210 according example embodiments. Referring to FIG. 5, the ½ powered voltage generator 210 may include a first section 501 for generating positive voltages +$V_{FS}$ and a second section 502 for generating negative voltages −$V_{FS}$. The structure and operations of first and second sections 501 and 502 may be substantially similar with the exception that the polarities of voltages $V_{FS}$ generated by the first and second sections 501 and 502 may be opposite to one another. For the purpose of simplicity, the operation of voltage generator 210 will be described with reference only to first section 501. The ½ powered voltage generator 210 may include a first capacitor 510 and a second capacitor 520. The first capacitor 510 and the second capacitor 520 may be connected in parallel with each other via switches 550, 551, 540, and 541.

The ½ powered voltage generator 210 may discharge the first capacitor 510 and the second capacitor 520 by short-circuiting switches in a first switch unit 560 and switches in a second switch unit 570 and opening switches 530, 540, 541, 550, 551, and 580. Next, the ½ powered voltage generator 210 may open the switches in the first switch unit 560 and the switches in the second switch unit 570 and may short-circuit the switches 551 and 580 to charge the first capacitor 510 with the full scale voltage $V_{FS}$. At this time, the second capacitor 520 may be totally discharged.

Next, the ½ powered voltage generator 210 may open the switch 580 and short-circuit the switches 550, 540 and 541 to connect the first capacitor 510 with the second capacitor 520 in parallel. At this time, when a voltage between two terminals of the first and second capacitors 510 and 520 is V(1), the voltage V(1) may have a relation of V(1)=C1/(C1+C2) $V_{FS}$ where C1 is capacitance of the first capacitor 510 and C2 is capacitance of the second capacitor 520. When C1 equals C2, V(1) may equal ½$V_{FS}$. The ½ powered voltage generator 210 may output ½ $V_{FS}$ as the divided voltage +Vdiv and may output −½ $V_{FS}$ as the divided voltage −Vdiv by closing switches 590 and 591. Next, the ½ powered voltage generator 210 may open the switches 550 and 551 and short-circuit the switches in the first switch unit 560 to totally discharge the first capacitor 510.

Next, the ½ powered voltage generator 210 may open the switches in the first switch unit 560 and short-circuit the switches 550 and 551 to connect the first capacitor 510 with the second capacitor 520 in parallel. At this time, a voltage between the two terminals of the first and second capacitors 510 and 520 may be ¼ $V_{FS}$ and the ½ powered voltage generator 210 may output ¼$V_{FS}$ as the divided voltage +Vdiv and may output −¼ $V_{FS}$ as the divided voltage −Vdiv by closing switches 590 and 591.

The ½ powered voltage generator 210 may operate the first capacitor 510 and the second capacitor 520 using a switched capacitor scheme and may sequentially output divided voltages which may be ½, ¼, ⅛, and 1/16 of the full scale voltage $V_{FS}$, respectively. According to example embodiments, the ½ powered voltage generator 210 may minimize or reduce an error in a divided voltage that may occur due to deviation in fabrication processes by alternately discharging the first capacitor 510 and the second capacitor 520. In actual implementation, C1 may be different from C2 due to the deviation in fabrication processes and an ideal divide voltage may not be generated. The ½ powered voltage generator 210 may output a divided voltage close to an ideal one by alternately operating the first capacitor 510 and the second capacitor 520.

Figure 6:
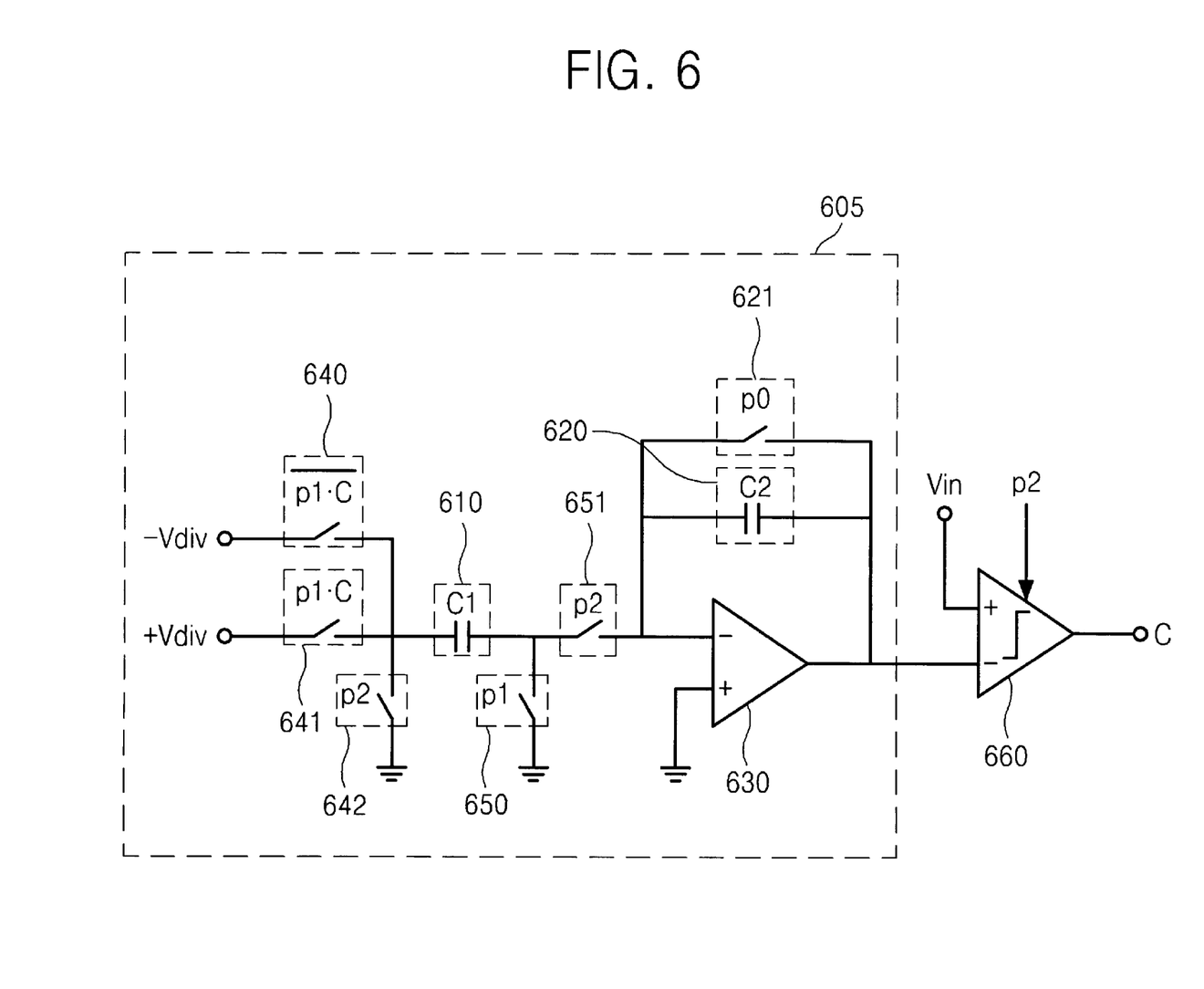
FIG. 6 illustrates an accumulator and a comparator according to example embodiments.

FIG. 6 illustrates an accumulator 605 and a comparator 660 according to example embodiments. Referring to FIG. 6, the accumulator may include a first capacitor 610, a second capacitor 620, and an operational amplifier 630.

The accumulator 605 may short-circuit a switch 621 to discharge the second capacitor 620. Once the second capacitor 620 is discharged, the accumulator may open the switch 621. The accumulator 605 may open switches 642 and 651 and short-circuit a switch 650. The accumulator 605 may short-circuit one between switches 640 and 641 and open the other between the two switches 640 and 641 in response to a value of an output bit C. At this time, a voltage between the two terminals of the first capacitor 610 may be a divided voltage −Vdiv when the switch 640 is short-circuited and is a divided voltage +Vdiv when the switch 641 is short-circuited.

Next, the switches 641, 640, and 650 may be opened. The accumulator 605 may short-circuit the switches 642 and 651 to enable the first capacitor 610 to perform a switched capacitor operation. At this time, an output voltage of the operational amplifier 630 may be +(C1/C2)Vdiv or −(C1/C2)Vdiv. A voltage between the two terminals of the second capacitor 620 may be the same as the output voltage of the operational amplifier 630. When C1=C2, the output voltage of the operational amplifier 630 may be +Vdiv or −Vdiv. At this time, the comparator 660 may compare an input signal voltage Vin with the output voltage of the operational amplifier 630 and may generate a next output bit. According to an embodiment, the comparator 660 may compare the input signal voltage Vin with the output voltage of the operational amplifier 630 in response to a clock signal p2. That is, the comparing operation of the comparator 660 may be synchronized with the clock signal p2.

Next, the switches 642 and 651 may be opened. The accumulator 605 may short-circuit the switch 650 and short-circuit the switch 640 or 641 to charge the first capacitor 610 so that the voltage between the two terminals of the first capacitor 610 is a next divided voltage.

Thereafter, in the same manner as described above, the accumulator 605 may enable the first capacitor 610 to perform the switched capacitor operation so that the next divided voltage is added to the voltage between the two terminals of the second capacitor 620. As a result, the output voltage of the operational amplifier 630 may be the accumulation of sequential divided voltages. The comparator 660 may compare the accumulation of divided voltages (or reference voltages) with the input signal voltage Vin and sequentially generate output bits C.

Figure 7:
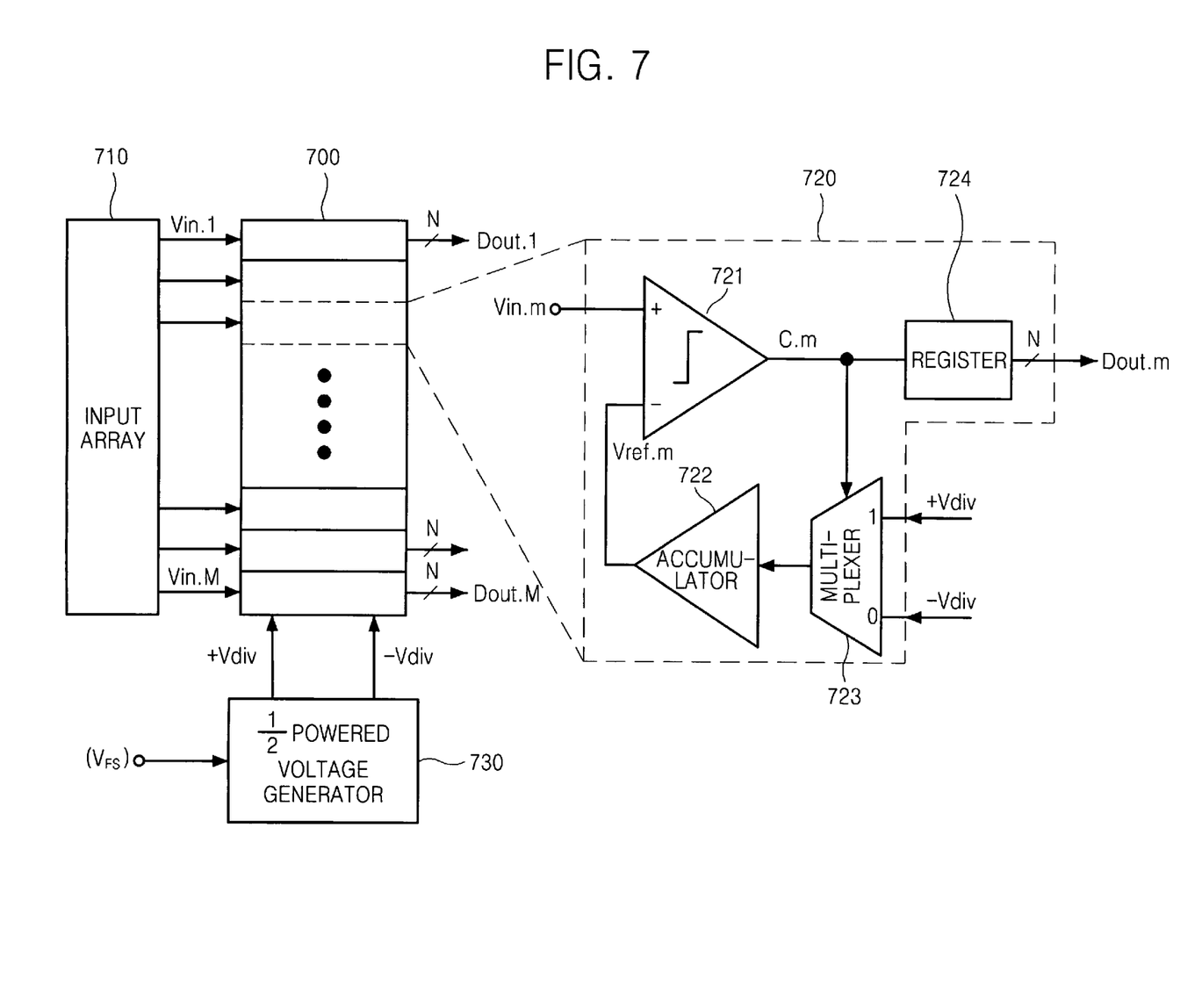
FIG. 7 illustrates an ADC according to example embodiments.

FIG. 7 illustrates an ADC according to example embodiments. Referring to FIG. 7, the ADC may include an input array 710, a ½ powered voltage generator 730, and an analog-to-digital (AD) conversion part 700.

The input array 710 may output M input signals. The ½ powered voltage generator 730 may successively divide a full scale voltage by 2 to generate divided voltages. The ½ powered voltage generator 730 may output one of the generated divided voltages at a time. When outputting a divided voltage, the ½ powered voltage generator 730 may output two values +Vdiv and −Vdiv of the divided voltage which may be differential voltages having the same magnitudes and inversed signs.

The AD conversion part 700 may include M unit converters. Each unit converter may include a comparator 721, an accumulator 722, a multiplexer 723, and a shift register 724. The accumulator 722 may update a reference voltage according to a divided voltage and a first output bit with respect to each input signal. The comparator 721 may compare the updated reference voltage with a voltage of the input signal and may generate a second output bit following the first output bit. The multiplexer 723 may transmit one of the divided voltages +Vdiv and −Vdiv to the accumulator 722 in response to the first output bit. The shift register 724 may store the first output bit and then store the second output bit after shifting the first output bit. The shift register 724 may sequentially store output bits that have been sequentially output from the comparator 721 and may generates a digital output bitstream.

An m-th unit converter 720 is illustrated in FIG. 7. In the m-th unit converter 720, the accumulator 722 may update a reference voltage Vref.m according to a first output bit C.m and a divided voltage with respect to an m-th input signal Vin.m. The shift register 724 may generate a digital output bitstream Dout.m. The digital output bitstream Dout.m may be a bitstream of N bits.

The ADC illustrated in FIG. 7 may have a structure in which the single ½ powered voltage generator 730 is shared by a plurality of unit converters when a plurality of analog inputs are processed in parallel. Since an output of the ½ powered voltage generator 730 may be simultaneously used by all of the unit converters to update their reference voltages, a necessary area may be reduced by enabling the unit converters to share the ½ powered voltage generator 730. In addition, when the ½ powered voltage generator 730 is shared, the ½ powered voltage generator 730 may be disposed more freely than the input array 710 or the unit converters, and therefore, the degree of freedom in layout of the ADC may be enhanced and more efficient arrangement can be accomplished in the same area.

In an ADC method according to example embodiments, divided voltages may be generated by successively dividing a full scale voltage by 2. One of the generated divided voltages may be output. A reference voltage may be updated according to a divided voltage and an output bit. An updated reference voltage may be compared with an input signal voltage and a next output bit may be generated. The next output bit may be stored in a shift register so that a digital output bitstream may be generated. When the digital output bitstream is N bits in length, the above-described operation is performed N times so that voltage of an analog input signal may be converted into the digital output bitstream.

According to example embodiments, a divided voltage corresponding to ½ of a previous divided voltage may be sequentially output according to a time period. According to example embodiments, a reference voltage may be updated by subtracting or adding a current divided voltage from or to a current reference voltage according to a current output bit.

According to example embodiments, a second divided voltage corresponding to ½ of a first divided voltage may be generated. A second reference voltage may be generated by subtracting or adding the second divided voltage from or to a first reference voltage according to a first output bit. The second reference voltage may be compared with an input signal voltage and a second output bit may be generated. The second divided voltage may be output a predetermined or reference time period after the first divided voltage is output.

In the above description, a signal is represented by voltage, but the representation of a signal is not restricted to voltage or current. A signal may be represented by various forms.

The ADC method according to example embodiments may be manifested by program commands that can be executed in various computer devices and can be recorded in or on a computer readable recording medium. The computer readable recording medium may include a program command, a data file, a data structure, or combination thereof. The program commands recorded in or on the medium may be specially designed and configured for example embodiments but may have already been known and used by those skilled in the art of computer software. Examples of the computer readable recording medium may include magnetic storage media, for example disks, floppy disks, and magnetic tapes; optical recording media CD-ROMs and DVDs; magneto-optical media, for example floptical disks; and hardware devices such as ROM, RAM, and flash memory which may be specially structured to store and execute program commands. Examples of program commands may include machine codes, for example codes made by a compiler, and high-level codes that can be executed on a computer using an interpreter. The hardware devices may be configured to operate as at least one software module in order to execute the operations of example embodiments and vice versa.

According to example embodiments, an ADC having a new structure that may not belong to conventional categories is provided. In addition, an ADC that may provide a similar function to that of a conventional successive approximation ADC is provided only using a voltage divider and an accumulator. Furthermore, an area of an ADC may be remarkably decreased.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. An analog-to-digital converter comprising:
   a ½ powered signal generator configured to generate divided signals by successively dividing a full scale signal by 2 and to output one of the divided signals;
   an accumulator configured to update a reference signal according to a current divided signal and a current output bit; and
   a comparator configured to compare the updated reference signal with an input signal and generate a next output bit, and
   wherein the ½ powered signal generator includes a first capacitor and a second capacitor which are connected in parallel with each other via a switch, and
   wherein the ½ powered signal generator is configured to generate a voltage of the current divided signal by storing-and-discharging a voltage of a previous divided signal in the first capacitor or in the second capacitor according to switching the switch.

2. The analog-to-digital converter of claim 1, wherein the ½ powered signal generator is further configured to output the current divided signal corresponding to ½ of a previous divided signal according to a time period.

3. The analog-to-digital converter of claim 1, further comprising a shift register configured to store the next output bit.

4. The analog-to-digital converter of claim 1, wherein the accumulator is further configured to subtract the current divided signal from or add the current divided signal to the reference signal according to the current output bit.

5. The analog-to-digital converter of claim 1, wherein
   the divided signals include a first and second divided signal, the ½ powered signal generator is configured to generate the second divided signal corresponding to ½ of the first divided signal and output the second divided signal, and the accumulator is configured to generate the updated reference signal by subtracting the second divided signal from or adding the second divided signal to a first reference signal according to the current output bit.

6. The analog-to-digital converter of claim 5, wherein the ½ powered signal generator outputs the second divided signal a reference period of time after outputting the first divided signal.

7. The analog-to-digital converter of claim 6,
   wherein the ½ powered signal generator opens the switch to store a voltage of the first divided signal in the first capacitor and to discharge the second capacitor and then short-circuits the switch to connect the first capacitor with the second capacitor in parallel and to generate a voltage of the second divided signal.

8. The analog-to-digital converter of claim 7, wherein the ½ powered signal generator stores the voltage of the first divided signal in the first capacitor during a first time period and stores the voltage of the second divided signal in the second capacitor during a second time period following the first time period.

9. The analog-to-digital converter of claim 1 further comprising:
an input array configured to output a plurality of input signals, wherein
the accumulator is configured to update the reference signal according to the current divided signal and the current output bit with respect to a corresponding one of the input signals, and the comparator is configured to compare the updated reference signal with the corresponding input signal and generate the next output bit following the current output bit.

10. An analog-to-digital conversion method comprising:
generating divided signals by successively dividing a full scale signal by 2;
outputting one of the divided signals as a current divided signal;
updating a reference signal according to the current divided signal and a current output bit; and
comparing an updated reference signal with an input signal and generating a next output bit, wherein the generating divided signals includes generating a voltage of the current divided signal by storing-and-discharging a voltage of a previous divided signal in a first capacitor or in a second capacitor according to switching the switch, wherein the first capacitor and the second capacitor are connected in parallel with each other via a switch.

11. The analog-to-digital conversion method of claim 10, wherein the outputting one of the divided signals comprises outputting the current divided signal corresponding to ½ of a previous divided signal according to a time period.

12. The analog-to-digital conversion method of claim 10, further comprising storing the next output bit and generating a digital output bitstream.

13. The analog-to-digital conversion method of claim 10, wherein the updating the reference signal comprises subtracting the current divided signal from or adding the current divided signal to the reference signal according to the current output bit.

14. The analog-to-digital conversion method of claim 10, wherein generating the divided signals includes generating the current divided signal corresponding to ½ of a first divided signal, and updating the reference signal includes generating the updated reference signal by subtracting the current divided signal from or adding the current divided signal to a first reference signal according the a current output bit.

15. The analog-to-digital conversion method of claim 14, wherein the current divided signal is output a predetermined period of time after outputting the first divided signal.

16. A computer readable recording medium storing a program for executing the method of claim 10.

* * * * *